United States Patent [19]

Feinberg et al.

[11] 4,274,124
[45] Jun. 16, 1981

[54] THICK FILM CAPACITOR HAVING VERY LOW INTERNAL INDUCTANCE

[75] Inventors: Irving Feinberg, Poughkeepsie; Leon L. Wu, Hopewell Junction, both of N.Y.

[73] Assignee: International Business Machines Corporation, Armonk, N.Y.

[21] Appl. No.: 106,640

[22] Filed: Dec. 26, 1979

[51] Int. Cl.³ .......................................... H01G 1/147
[52] U.S. Cl. .................................. 361/275; 361/308; 361/309; 361/321
[58] Field of Search .............. 361/275, 321, 303, 304, 361/308, 309

[56] References Cited

U.S. PATENT DOCUMENTS

| | | | |
|---|---|---|---|
| 3,308,359 | 3/1967 | Hayworth | 361/275 X |
| 3,346,790 | 10/1967 | Blank | 361/275 X |
| 3,452,257 | 6/1969 | Bezko | 361/275 X |
| 3,838,320 | 9/1974 | Klein | 361/303 |

FOREIGN PATENT DOCUMENTS 614076 12/1948 United Kingdom ..................... 361/304

*Primary Examiner*—Elliot A. Goldberg
*Attorney, Agent, or Firm*—Robert J. Haase

[57] ABSTRACT

A decoupling capacitor for highly integrated, fast switching logic circuit modules. The capacitor comprises stacked ceramic sheets having metallized surfaces. The sheets are connected together in groups. Alternate groups are connected to a first electrode. Intervening alternate groups are connected to a second electrode. The connections are all made to the same ends of all the sheets so that the current flows in opposite directions through adjacent facing plates.

6 Claims, 6 Drawing Figures

THICK FILM CAPACITOR HAVING VERY LOW INTERNAL INDUCTANCE

DESCRIPTION

BACKGROUND OF THE INVENTION

1. Field of the Invention

The invention generally relates to decoupling capacitors and, more particularly, to decoupling capacitors characterized by low internal inductance.

2. Description of the Prior Art

An effective decoupling capacitor is essential to the noise isolation of very fast switching, highly integrated logic circuit modules so that switching noise is not coupled between the modules due to the common primary power source. An effective decoupling capacitor for such applications is one having extremely whereby very fast charging and discharging are achieved.

Conventional thick film capacitors (those having relatively thick dielectric films of 1 to 3 mils thickness and high dielectric constant of 1000) are inexpensive to fabricate and exhibit good reliability. However, such capacitors possess relatively high internal inductance. Conventional thin film capacitors, on the other hand, are expensive to make and are not as reliable as the thick film type but they are of relatively low inductance.

It is desirable, therefore, that a way be found to reduce the internal inductance of the prior art thick film capacitors to values approaching those of the thin film capacitors while retaining the advantages of low cost and good reliability.

SUMMARY OF THE INVENTION

A capacitor structure characterized by very low internal inductance is achieved by stacking closely spaced ceramic sheets having metallized surfaces and connecting the same ends of the sheets to respective electrodes in such a way that current flows in opposite directions through adjacent facing plates. The sheets are connected together in groups. Alternate groups are connected to one of the electrodes. The intervening alternate groups are connected to the other of the electrodes.

DESCRIPTION OF THE PREFERRED EMBODIMENT

Figure 1:
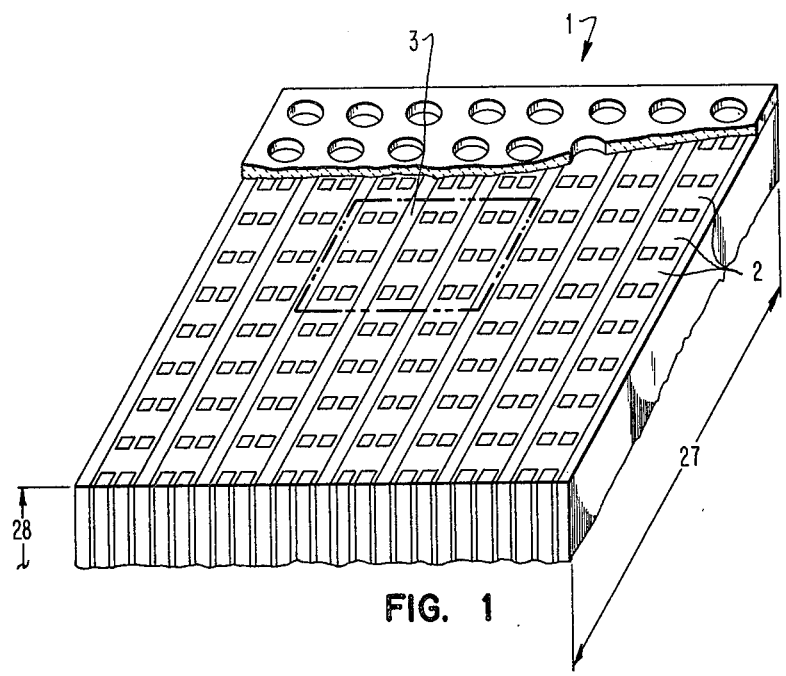
FIG. 1 is a perspective external view of a capacitor designed in accordance with the present invention.

The capacitor 1 of FIG. 1 comprises stacked vertically disposed sheets of conductively clad ceramic material. The sheets are connected together in groups by localized regions 2 of conductive material imbedded in the top edges of the sheets. The structure may be seen more clearly by reference to FIG. 1A which is an enlarged view of the dashed portion 3 of capacitor 1.

Figure 1A:
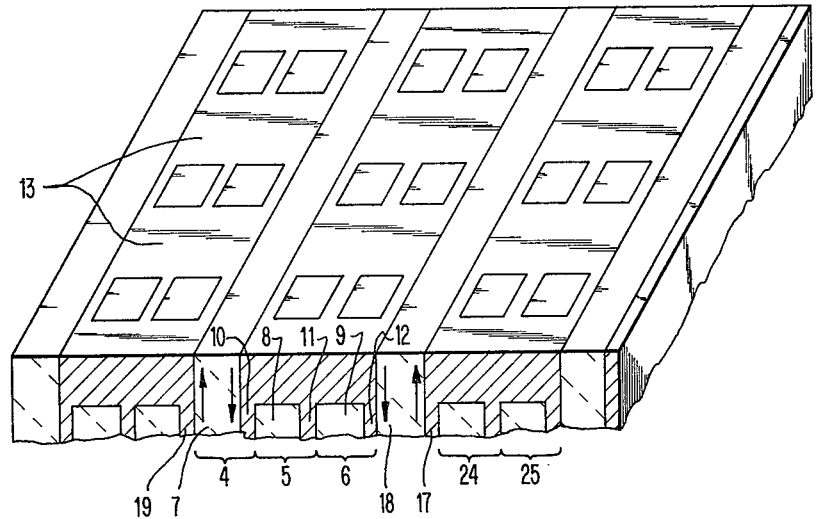
FIG. 1A is an enlarged perspective view of the dashed portion of the capacitor of FIG. 1.
Figure 2:
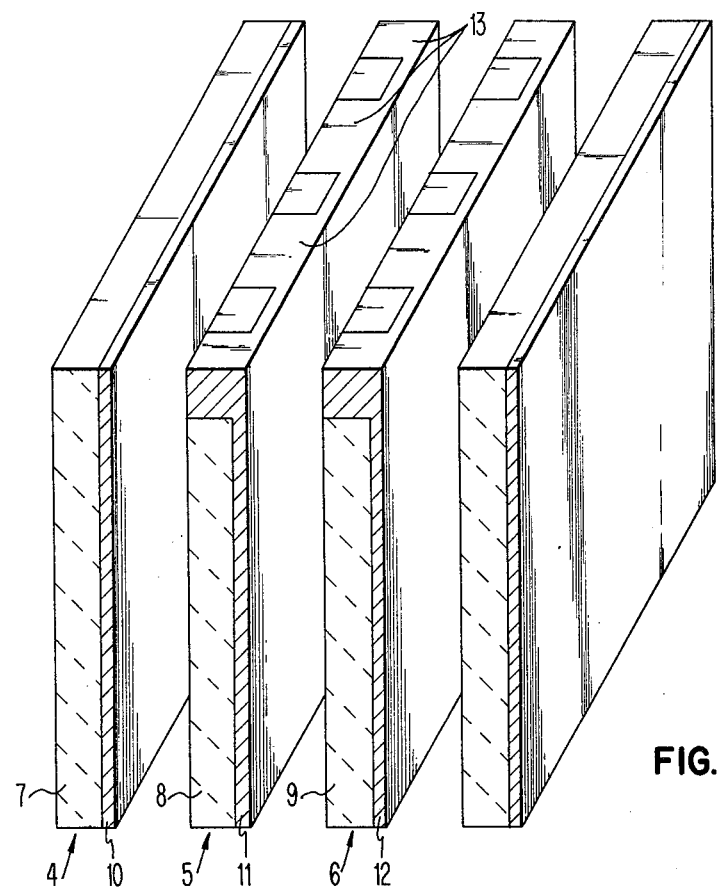
FIG. 2 is an exploded view of FIG. 1A.

Referring to FIG. 1A, sheets 4, 5 and 6 comprise respective thin substrates 7, 8 and 9 of ceramic material such as a barium titanate base material. Each of the substrates is covered with a respective layer 10, 11 and 12 of conductive material such as silver palladium paste. The top edges of substrates 5 and 6 are punched out. The punched out regions are filled with conductive paste 13 so that conductive layers 10, 11 and 12 are electrically connected to each other in a group after the group is assembled. An exploded view of the group, prior to assembly, is shown in FIG. 2. Assembly is accomplished by pressing the substrates together and sintering.

In a typical design, the thickness of the ceramic substrates is in the range of about 2 to 2½ mils and the thickness of the conductive layer is about ½ mil.

Figure 3A:
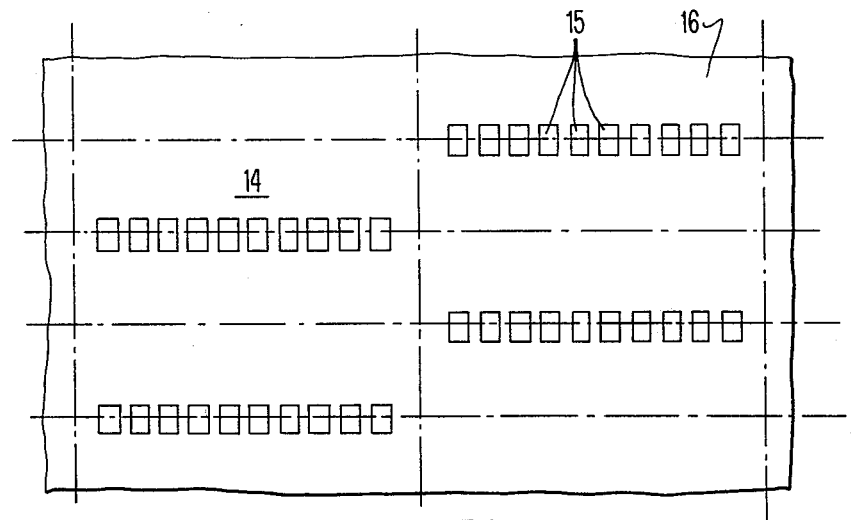
FIGS. 3A and 3B depict the fabrication of one of the sheets used in FIGS. 1, 1A and 2.
Figure 3B:
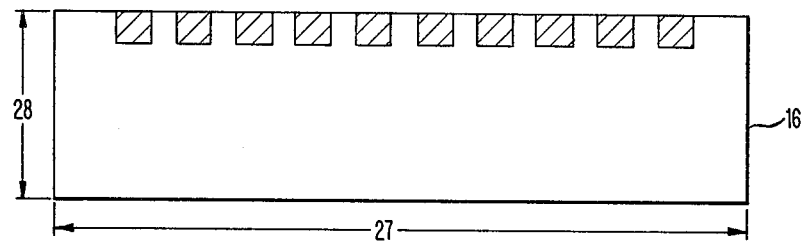

Sheets such as sheets 5 and 6 are cut out of larger ceramic sheet material 14 as shown in FIG. 3A. The larger sheet is punched through in rectangular regions 15 having dimensions of 6 by 20 mils in a typical instance. Then, the punched sheet 14 is covered by conductive paste which is applied by squeegee to a desired thickness while simultaneously filling the punched out regions 15. Individual sheets such as sheet 16 of FIG. 3B are obtained by cutting sheet 14 of FIG. 3A along the dashed lines.

Returning now to FIGS. 1 and 1A, additional groups of sheets corresponding to sheets 4, 5 and 6 are stacked, pressed and sintered together with sheets 4, 5 and 6 to yield the overall capacitor 1 of FIG. 1. The overall capacitor 1 in effect, is a plurality of constituent capacitors connected in parallel in a manner to be described. One of the constituent capacitors is formed by conductive layer 12, conductive layer 17 and intervening dielectric (ceramic) layer 18. Another adjacent constituent capacitor is formed by conductive layer 19, conductive layer 10 and intervening dielectric layer 7. Inasmuch as the electrical connections are made to each constituent capacitor via the conductive metal 13 at the top edges of the facing conductive conductive layers, the currents flowing during the charging and discharging of each capacitor flow in opposite spacial directions as indicated by the arrows. Such flow of current in the closely spaced capacitor plates causing a substantial cancellation of the inductive fields associated therewith and reduces the internal inductance of each capacitor.

In general, the internal inductance of each constituent capacitor is reduced as the thickness of the dielectric layers, such as layers 7 and 18, is reduced and is reduced as the length 27 of each of the sheets is increased. For minimum internal inductance, it is desirable to minimize the height 28 of each sheet consistent with fabrication and total capacitance requirements. In a typical application, the length and height of each of the sheets are 100 mils and 50 mils, respectively.

Figure 4:
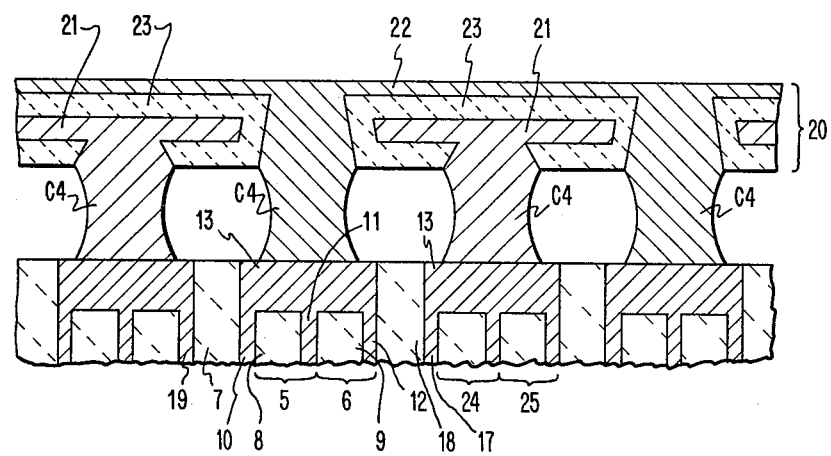
FIG. 4 is a cross-sectional view of the multilevel conductors for connecting the sheets of FIGS. 1, 1A and 2 to respective capacitor terminals.

The manner in which the metal-filled regions 13 are connected together to form the desired overall capacitor can be understood by reference to FIG. 4. The constituent capacitor elements corresponding to those of FIGS. 1A and 2 are identified by the same reference numerals. Solder reflow balls (C4) are placed at each of the metallized regions 13 to join the capacitor plate connecting structure 20 to the constituent capacitors. The connecting structure 20 comprises two levels of metal 21 and 22 separated by insulating layer 23. Layers 21 and 23 are apertured over alternate groups of sheets such as the group consisting of sheets 5 and 6 in order to permit a conductive connection via the C4 balls between top conductive layer 22 and each of the metallized regions 13 of sheets 5 and 6. The intervening alternate groups of sheets such as the group consisting of sheets 24 and 25 are similarly connected to bottom conductive layer 21 via the C4 balls.

It is preferred that the C4 balls be evaporated onto the regions 13 with the use of an additional ceramic sheet 26 which is apertured to form a via matrix of discrete connectors forming spaced parallel rows and spaced parallel columns at right angle to said rows in registration with the matrix of regions 13 as shown in FIG. 1. The additional sheet is pressed and sintered across the top surface of the structure 1 of FIG. 1 prior to C4 evaporation and serves as a solder dam, during reflow when the connecting structure 20 of FIG. 4 is being added, to prevent uncontrolled solder flow between the regions 13 along the edges of the conductive layers such as layers 10, 11 and 12.

We claim:

1. A capacitor comprising a multiplicity of closely spaced conductive plates, some of said plates being connected to a first terminal, the remainder of said plates being connected to a second terminal, said terminals comprising first and second parallel levels of metal separated by a first dielectric layer, said first and second levels of metal extending in a direction perpendicular to the direction of said plates said plates being spaced from each other by second dielectric layers, and means for connecting said plates at the same ends thereof to respective ones of said terminals whereby the current of said capacitor flows in opposite spacial directions in the adjacent facing plates, said means for connecting comprising a matrix of discrete connectors forming spaced parallel rows and spaced parallel columns at right angles to said rows.

2. The capacitor of claim 1 wherein said means for connecting connects said plates in spaced groups, alternate ones of said groups being connected to said first electrode, and intervening alternate ones of said groups being connected to said second electrode.

3. The capacitor of claim 2 wherein each said group consists of the same number of plates.

4. The capacitor of claim 1 wherein each said dielectric layer is a ceramic sheet, and each said conductive plate is a conductive layer on said ceramic sheet.

5. The capacitor of claim 4 wherein said ceramic sheet is a barium titinate base material, and said conductive layer is a silver palladium paste.

6. The capacitor of claim 1 where adjacent ones of said plates are spaced by 1 to 3 mils.

* * * * *